United States Patent [19]

Norman et al.

[11] Patent Number: 4,864,161
[45] Date of Patent: Sep. 5, 1989

[54] MULTIFUNCTION FLIP-FLOP-TYPE CIRCUIT

[75] Inventors: Kevin A. Norman, Belmont; Hock-Chuen So, Milpitas; Kerry S. Veenstra, Concord; Sau-Ching Wong, Hillsborough, all of Calif.

[73] Assignee: Altera Corporation, Santa Clara, Calif.

[21] Appl. No.: 190,530

[22] Filed: May 5, 1988

[51] Int. Cl.[4] .......................................... H03K 3/037
[52] U.S. Cl. ................... 307/272.2; 307/465; 307/480; 365/154
[58] Field of Search ............. 307/465, 471, 480–481, 307/269, 272.2, 276; 365/154; 371/25

[56] References Cited

U.S. PATENT DOCUMENTS

| | | | |
|---|---|---|---|
| 3,566,153 | 2/1971 | Spencer | 307/205 |
| 4,124,899 | 11/1978 | Birkner et al. | 364/716 |
| 4,422,072 | 10/1983 | Cavlan | 307/465 X |
| 4,609,986 | 9/1986 | Hartmann et al. | 364/200 |
| 4,617,479 | 10/1986 | Hartmann et al. | 307/465 |
| 4,677,318 | 6/1987 | Veenstra | 307/465 |
| 4,689,497 | 8/1987 | Umeki et al. | 307/272.2 |
| 4,692,633 | 9/1987 | Ngai et al. | 307/480 X |
| 4,703,206 | 10/1987 | Cavlan | 307/465 |
| 4,713,792 | 12/1987 | Hartmann et al. | 364/900 |
| 4,717,912 | 1/1988 | Harvey et al. | 307/465 X |
| 4,756,006 | 7/1988 | Richard | 307/480 X |
| 4,758,747 | 7/1988 | Young et al. | 307/465 |
| 4,771,285 | 9/1988 | Agrawal et al. | 307/465 X |
| 4,791,602 | 12/1988 | Resnick | 307/465 X |

OTHER PUBLICATIONS

Puri et al., "Flush-Through Latch", IBM T.D.B., vol. 24, No. 7A, Dec. 1981, pp. 3115-3116, (307/480).
Farrell et al., "Edge-Triggered LSSD Compatible Set/Reset Latch", IBM T.D.B., vol. 26, No. 5, Oct. 1983, pp. 2249-2250, (307/272.2).
R. R. Munoz et al., "Automatic Partitioning of Programmable Logic Devices," *VLSI Systems Design*, Oct. 1987, pp. 74–76, 78, and 86.
E. Goetting et al., "A CMOS Electrically-Reprogrammable ASIC with Multi-Level Random Logic Capabilities", 1986 IEEE *International Solid-State Circuits Conference*, pp. 244–245 and 359–360, 1986.

*Primary Examiner*—David Hudspeth
*Attorney, Agent, or Firm*—Robert R. Jackson

[57] ABSTRACT

A flip-flop-type circuit capable of operating either as a conventional D flip-flop or as a device which merely passes through the data applied to it (so-called "flow-through mode"). In the flow-through mode, the circuit has the additional capability of being able to latch in the data flowing through it at any time. Thus the circuit can also operate as a level-sensitive latch.

8 Claims, 2 Drawing Sheets

| P | C | D | CLK | Q |
|---|---|---|---|---|
| 1 | 1 | 0 | ↑ | 0 |
| 1 | 1 | 1 | ↑ | 1 |
| 1 | 0 | X | X | 0 |
| 0 | 1 | X | X | 1 |
| 0 | 0 | X | 0 | $Q_0$ |
| 0 | 0 | 0 | 1 | 0 |
| 0 | 0 | 1 | 1 | 1 |

FIG. 2

| S | R | G | D | Q |
|---|---|---|---|---|
| 0 | 0 | 1 | 0 | 0 |
| 0 | 0 | 1 | 1 | 1 |
| 0 | 0 | 0 | X | $Q_0$ |
| 1 | 0 | X | X | 1 |
| 0 | 1 | X | X | 0 |

MULTIFUNCTION FLIP-FLOP-TYPE CIRCUIT

BACKGROUND OF THE INVENTION

This invention relates to digital logic circuitry, and more particularly to a flip-flop-type circuit capable of several different modes of operation.

In concurrently filed, commonly assigned, co-pending U.S. Patent applications Ser. Nos. 190,663 and 190,571 (both of which are hereby incorporated by reference herein), a flip-flop-type circuit 123 is shown which is required to operate variously as (1) a D-type flip-flop, (2) a level-sensitive latch, or (3) a simple flow-through device. A need therefore exists for a logic circuit having these capabilities, and it is accordingly an object of this invention to provide such a circuit.

SUMMARY OF THE INVENTION

This and othere objects of the invention are accomplished in accordance with the principles of the invention by providing a circuit having data, preset, clear, and clock input terminals, and a data output terminal. When the preset and clear signals have a second polarity and the clock signal changes from a first polarity to a second polarity, the circuit applies to its data output terminal the signal applied to its data input terminal. When the preset signal has a second polarity and the clear signal has a first polarity, the circuit applies a first polarity to its data output terminal. When the preset signal has a first polarity and the clear signal has a second polarity, the circuit applies a second polarity to its data output terminal. When the preset, clear, and clock signals have a first polarity, the circuit holds its data output terminal polarity. And when the preset and clear signals have a first polarity and the clock signal has a second polarity, the circuit applies to its data output terminal the signal applied to its data input terminal.

Further features of the invention, its nature and various advantages will be more apparent from the accompanying drawings and the following detailed description of the invention.

BRIEF DESCRIPTION OF THE DRAWINGS

FIG. 2 is a truth table useful in explaining the operation of the circuit of FIG. 1.

FIG. 3 is a truth table useful in explaining the operation of two of the components of the circuit of FIG. 1.

DETAILED DESCRIPTION OF THE PREFERRED EMBODIMENTS

Figure 1:
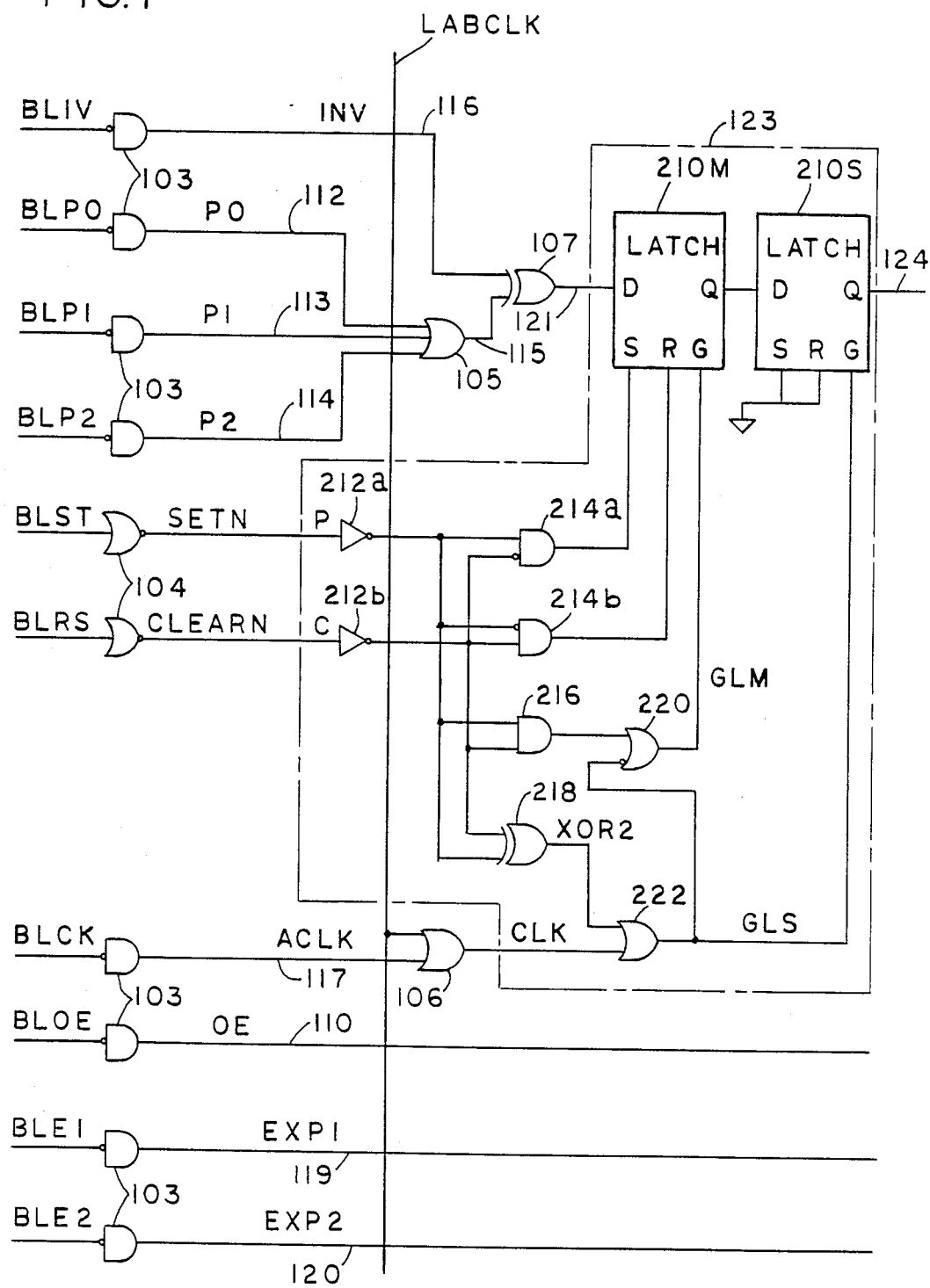
FIG. 1 is a schematic block diagram of an illustrative embodiment of the circuit of this invention.

FIG. 1 shows part of the circuitry shown in FIG. 5 of application Ser. No. 190,663. (FIG. 1 is also similar to a portion of FIG. 4 in Ser. No. 190,571, but for convenience herein, only FIG. 5 of Ser. No. 190,663 is referred to below.) Similar names and reference numbers are used for similar elements in these two drawings, although the pictorial arrangement of the elements differs sightly from one drawing to the other. The elements surrounded by chain-dotted line 123 herein correspond to flip-flop 123 in Ser. No. 190,663. (Inverters 212 correspond to the active-low inputs shown on the P and C terminals of flip-flop 123 in that application.)

FIG. 2 is a truth table for the overall operation of flip-flop 123. (FIG. 2 corresponds to FIG. 9 in Ser. No. 190,663 and to FIG. 8 in Ser. No. 190,571.) The first four lines of FIG. 2 show that when one or both of the preset P and clear C signals is 1, flip-flop 123 operates like a normal D flip-flop. The last three lines of FIG. 2 show that when P and C are both O (which is normally an illegal condition for a D flip-flop with active-low inputs), flip-flop 123 acts like a flow-through devicce (i.e., Q=D, assuming that the clock signal CLK remains high as shown in the last two lines of FIG. 2), but that (as shown in the third from the last line in FIG. 9) the flow-through data can also be latched into flip-flop 123 by causing CLK to go low (because Qo indicates that Q then holds whatever value it had just before CLK went low). In other words, in addition to being capable of operating as a D flip-flop (first four lines of FIG. 2) or as a flow-through device (last two lines of FIG. 2), flip-flop 123 can also act as a level-sensitive latch by latching in the flow-through data when CLK goes low (third from last line of FIG. 2). FIG. 1 shows the detailed construction of device 123 in accordance with the principles of this invention in order to realize the above-described modes of operation.

Each of latches 210M and 210S is a conventional D latch. Latch 210M is the so-called "master" latch, while latch 210S is the so-called "slave" latch. Each of latches 210 has a data input terminal D, an output terminal Q, a set input terminal S, a reset input terminal R, and a gate or "function enable" input terminal G. FIG. 3 is a truth table for the operation of each of latches 210. As shown in that FIG., when both the set S and reset R inputs of a latch 210 are O and the gate G input is 1, then the Q output follows the data D input. However, when all of S, R, and G are O, the Q output holds whatever value (denoted Qo) it had just before G went low. In other words, with S and R both O, Q is insensitive to changes in D while G is low. When S is 1 and R is O, Q is 1 regardless of G and D. Similarly, when S is O and R is 1, Q is O regardless of G and D. In the ensuing discussion, an M or S suffix is sometimes used to distinguish the signals associated with master latch 210M from the signals associated with slave latch 210S. For example, DM refers to the D signal of master latch 210M, while DS refers to the D signal of slave latch 210S.

The P and C signals (corresponding respectively to the P and C signals in Ser. No. 190,663) and to the PRE and CLR signals in Ser. No. 190,571) are respectively inverted by inverters 212a and 212b and then applied to one input of each of AND gates 214a and 214b. The inverse of the inverted C signal is applied to the other input of AND gate 214a, and the inverse of the inverted P signal is applied to the other input of AND gate 214b. The effect of AND gates 214 is to make it impossible for both SM and RM to be 1 at the same time. Assuming, however, that no more than one of P and C is 0, gates 214 effectively apply the inverted P signal to the S terminal of latch 210M, and the inverted C signal to the R terminal of latch 210M. Accordingly, if either P or C is 0 QM is determined by which of P and C is 0. QM is then passed through to QS because with either P or C 0, the output XOR2 of EXCLUSIVE OR ("XOR") gate 218 becomes 1 and the output GLS of OR gate 222 also becomes 1. (SS and RS are always tied low.) The above-described operation corresponds to the third and fourth lines of FIG. 2.

If both P and C are 1, SM and RM are both O. The output of AND gate 216 is O, and so is the output of XOR gate 218. OR gate 222 then passes whatever CLK signal is applied to it, and that signal is inverted by OR gate 220. Assuming that the CLK signal is initially low, GM is high and DM is passed to QM and thereby applied to DS. When the CLK signal subsequently goes high, DS is passed to QS. This mode of operation corresponds to the first two lines of FIG. 2.

If P and C are both 0, SM and SR are also both O. The output of AND gate 216 is 1, the output of OR gate 220 is 1, and the output of XOR gate 218 is O. If CLK is also 1 (e.g., because BLCK is tied low), the output of OR gate 106 is 1, and the output of OR gate 222 is also 1. This means that each of latches 210 operates as shown in the first two lines of FIG. 3 so that QS=DM. In other words, whatever data is applied to DM flows through to QS. This mode of operation corresponds to the last two lines of FIG. 2.

If, at any time during the flow-through operation described immediately above, CLK goes low (e.g., because BLCK is not in fact permanently tied low), the output of OR gate 222 becomes O. This causes latch 210S to operate as shown in the third line in FIG. 3, thereby latching in the current value Qo of QS. This mode of operation corresponds to the fifth line of FIG. 2.

From the foregoing, it will be apparent that the circuit of FIG. 3 can be used to supply on lead 124 either the "registered" or "combinatorial" output of XOR gate 107 (registered output results from operation of device 123 as a D flip-flop (first four lines of FIG. 2); combinatorial output results from operation of device 123 in the flow-through mode (last two lines of FIG. 2)), and that in addition, the flow-through mode data can be latched into device 123 at any time by causing the CLK signal to go low. Device 123 is therefore highly flexible and of great utility in programmable logic device ("PLDs") such as are shown in Ser. Nos. 190,663 and 190,571.

Although particular signal values like "0" and "1" or "first polarity" and "second polarity" are referred to herein and in the appended claims, it will be understood that these values and terms are purely arbitrary, and that they are used solely for purposes of illustration. Thus, for example, although "first polarity" is uniformly equated with logic 0, and "second polarity" is uniformly equated with logic 1 herein as an aid to understanding the specification and claims, this is not necessarily the case, and the polarity or value of various signals can be reversed or otherwise altered without departing from the scope and spirit of the invention. As another example, whereas the specification and claims sometimes refer to applying the inverse of a particular signal to a particular component, if the polarity of that signal were reversed, then the signal could be applied directly (without inversion) to that component. Again, such polarity reversals and the consequent elimination (or addition) of inversions is entirely within the scope of the invention.

We claim:

1. A multifunctional flip-flop-type device having data, preset, clear, and clock input terminals, and a data output terminal comprising:
   first means for applying the signal applied to the data input terminal to the data output terminal when the preset and clear signals have a second polarity and the clock signal changes from a first polarity to a second polarity;
   second means for applying a signal having a first polarity to the data output terminal when the preset signal has a second polarity and the clear signal has a first polarity, and for applying a signal having a second polarity to the data output terminal when the preset signal has a first polarity and the clear signal has a second polarity;
   third means for holding the signal applied to the data output terminal constant when the preset, clear, and clock signals have a first polarity; and
   fourth means for applying the signal applied to the data input terminal to the data output terminal when the preset and clear signals have a first polarity and the clock signal has a second polarity.

2. A multimodal flip-flop-type device comprising:
   first and second D latches, each having a data input terminal, a set input terminal, a reset input terminal, a gate input terminal, and a data output terminal, the data output terminal of the first latch being connected to the data input terminal of the second latch, and the set and reset terminals of the second latch being connected to a source of a signal having a first polarity;
   a preset signal source;
   a clear signal source;
   a clock signal source;
   first means responsive to said preset and clear signals for applying the inverse of said preset signal to the set input terminal of said first latch and for applying the inverse of said clear signal to the reset terminal of said first latch unless both of said preset and clear signals have a first polarity, in which case said first means applies a signal having a first polarity to said set and reset terminals of said first latch;
   second means responsive to said preset and clear signals for applying a signal having a second polarity to the gate input terminal of said first latch when both of said preset and clear signals have said first polarity;
   third means responsive to said preset and clear signals for applying a signal having a second polarity to the gate input terminal of said second latch when either but not both of said preset and clear signals have said first polarity; and
   fourth means responsive to said preset, clear, and clock signals for applying the inverse of said clock signal to the gate input terminal of said first latch unless at least one of said preset and clear signals has said first polarity, and for applying said clock signal to the gate input terminal of said second latch unless one but not both of said preset and clear signals has said first polarity.

3. The apparatus defined in claim 2 wherein said first means comprises:
   a first AND gate having the inverse of the preset signal connected to one of its inputs and the clear signal applied to the other of its inputs, and having its output signal applied to the set input terminal of said first latch; and
   a second AND gate having the inverse of the clear signal applied to one of its inputs and the preset signal applied to the other of its inputs, and having its output signal applied to the reset input terminal of said first latch.

4. the apparatus defined in claim 2 wherein said second means comprises:
   a third AND gate having the inverse of the preset signal applied to one of its inputs and the inverse of the clear signal applied to the other of its inputs; and means for selectively applying the output signal of said third AND gate to the gate input terminal of said first latch.

5. The apparatus defined in claim 2 wherein said third means comprises:
an EXCLUSIVE OR gate having the inverse of the preset signal applied to one of its inputs and the inverse of the clear signal applied to the other of its inputs; and
means for selectively applying the output signal of said EXCLUSIVE OR gate to the gate input terminal of said second latch.

6. The apparatus defined in claim 5 wherein said means for selectively applying the output signal of said EXCLUSIVE OR gate to the gate input terminal of said second latch comprises:
a first OR gate having the output signal of said EXCLUSIVE OR gate applied to one of its inputs and said clock signal applied to the other of its inputs, and having its output signal applied to the gate input terminal of said second latch.

7. The apparatus defined in claim 6 wherein said second means comprises:
a third AND gate having the inverse of the preset signal applied to one of its inputs and the inverse of the clear signal applied to the other of its inputs; and
a second OR gate having the output signal of said second AND gate applied to one of its inputs and the inverse of the output signal of said first OR gate applied to the other of its inputs, and having its output signal applied to the gate input terminal of said first latch.

8. The apparatus defined in claim 2 wherein said fourth means comprises:
a third AND gate having the inverse of the preset signal applied to one of its inputs and the inverse of the clear signal applied to the other of its inputs;
an EXCLUSIVE OR gate having the inverse of the preset signal applied to one of its inputs and the inverse of the clear signal applied to the other of its inputs;
a first OR gate having the output of said EXCLUSIVE OR gate applied to one of its inputs and the clock signal applied to the other of its inputs, and having its output signal applied to the gate input terminal of said second latch; and
a second OR gate having the output of said third AND gate applied to one of its inputs and the inverse of the output signal of said first OR gate applied to the other of its inputs, and having its output signal applied to the gate input terminal of said first latch.

* * * * *